US009476930B2

(12) United States Patent
Sun et al.

(10) Patent No.: US 9,476,930 B2
(45) Date of Patent: Oct. 25, 2016

(54) LOCATING MULTI-PHASE FAULTS IN UNGROUNDED POWER DISTRIBUTION SYSTEMS

(71) Applicant: Mitsubishi Electric Research Laboratories, Inc., Cambridge, MA (US)

(72) Inventors: Hongbo Sun, Plymouth, MN (US); Anamika Dubey, Austin, TX (US)

(73) Assignee: Mitsubishi Electric Research Laboratories, Inc., Cambridge, MA (US)

( * ) Notice: Subject to any disclaimer, the term of this patent is extended or adjusted under 35 U.S.C. 154(b) by 441 days.

(21) Appl. No.: 14/175,019

(22) Filed: Feb. 7, 2014

(65) Prior Publication Data

US 2015/0226780 A1    Aug. 13, 2015

(51) Int. Cl.
*G06F 19/00* (2011.01)
*G01R 31/08* (2006.01)

(52) U.S. Cl.
CPC ........... *G01R 31/088* (2013.01); *G01R 31/086* (2013.01); *Y04S 10/522* (2013.01)

(58) Field of Classification Search
CPC ... G01R 29/18; G01R 31/023; G01R 31/024
USPC ........................ 702/59, 64–66, 182–185, 188
See application file for complete search history.

(56) References Cited

U.S. PATENT DOCUMENTS

| 5,682,100 | A |   | 10/1997 | Rossi et al. |
|-----------|---|---|---------|--------------|
| 5,726,574 | A | * | 3/1998  | Silverberg ........... G01R 31/083 324/133 |
| 5,773,980 | A |   | 6/1998  | Yang et al. |
| 6,483,435 | B2 |  | 11/2002 | Saha |
| 8,346,207 | B2 |  | 1/2013  | Stewart et al. |

* cited by examiner

*Primary Examiner* — Edward Raymond
(74) *Attorney, Agent, or Firm* — Gene Vinokur; James McAleenan; Hironori Tsukamoto

(57) ABSTRACT

A method determines a location of a fault in a faulty feeder section of an ungrounded power distribution system based on a type of the fault and the type of the faulty line. The method determines, if the faulty line is the lateral and the fault is phase-to-phase or double-phase-to-ground fault, the fault at a first point on an un-faulty phase of the lateral where a fault current equals a load current. The method determines, if the faulty line is the lateral and the fault is the three-phase fault, the location of the fault at a point with a minimal difference between imaginary parts of equivalent fault impedances. The method determines, if the faulty line is the mainline, the location of the fault at a point partitioning the faulty segment on two sub-segments with a ratio of lengths determined based on the voltages at the buses of the faulty segment.

10 Claims, 13 Drawing Sheets

100

LOCATING MULTI-PHASE FAULTS IN UNGROUNDED POWER DISTRIBUTION SYSTEMS

FIELD OF THE INVENTION

The present invention relates generally to power distribution systems, and more particularly to detecting and locating a multi-phase fault in an ungrounded power distribution system.

BACKGROUND OF THE INVENTION

Power distribution systems can be susceptible to fault conditions. The faults need to be corrected as soon as possible to reduce power outage time and avoid equipment damage. The correction of fault conditions requires an accurate and fast estimation of the locations of the faults.

Several methods have been used for locating multi-phase faults in distribution systems. For example, U.S. Pat. No. 5,682,100 describes traveling wave methods for estimating the fault location. Receiver stations are installed along the power distribution system at locations for sensing and recording time-intervals between each transient fault pulse. The fault location is determined based on these timing intervals, known time delays and the known propagation velocity of the electric power cables in the power distribution system.

The method described in U.S. Pat. No. 8,346,207 uses a similar approach. Multiple radio transceivers are installed at several locations along the distribution feeder and fault location is determined by a central computer comparing the time of arrival of the signals. However both methods require installation of additional fault measurement devices in the power distribution system, which increase cost.

Another method described in U.S. Pat. No. 5,773,980 describes an impedance-based fault location method for multi-phase faults in power distribution networks. That method calculates a fault impedance by correcting errors due to the interaction of fault resistance and load current. However, the method uses an approximate line model for distribution lines.

The method described in U.S. Pat. No. 6,483,435 calculates fault loop impedance to determine the fault location in an event of multi-phase faults. The method uses sequence components of line for fault location thus approximating the distribution line model and allowing approximation errors in the fault location. Also, the method assumes that the fault is resistive and does not include effects of the fault impedance.

Accordingly, there is a need for locating multi-phase faults in the power distribution systems.

SUMMARY OF THE INVENTION

Various embodiments of invention determine the location of a multi-phase fault, such as phase-to-phase, double-phase-to-ground and three-phase faults, in an ungrounded power distribution system based on measurements collected during operation of the system. For example, the measurements can be determined by the measuring units or sensors installed at feeder breakers and switches.

The embodiments of the invention are based on the realization that when multiple measuring points for distribution feeders are used, the possible faulted area can be attributed to a smaller section, of the feeder. Some embodiments of the invention use the measurements collected from the feeder breakers at the roots of feeders, and switches with sensors along the feeders. In the embodiments of the invention, the faulty feeder section are first determined based on the voltage and current measurements during the fault, and the possible faulty line type and faulty location are determined by analysis of the voltage and the current measured from the faulty feeder section.

Some embodiments of the invention use the distribution feeder topology for locating a multi-phase faults in an ungrounded distribution network. According to the number of measuring points for each feeder section, some embodiments of the invention use a two-ended algorithm for fault location, while another embodiments use a one-ended algorithm.

Some embodiments of the invention use the measurements available at both ends of the faulty feeder section and implements a one-ended or two-ended fault location algorithm based on the type of the fault type. Separate one-ended algorithms are used in an event of double-phase-to-ground, phase-to-phase, faults, or three-phase faults. A generic two-ended fault location algorithm is used for the faults in mainlines. The two-ended algorithm incorporated in the embodiment of the invention is applicable to all general cases of multi-phase faults, i.e. double-phase-to-ground, phase-to-phase faults, or three-phase faults, thus is generic in approach.

Some embodiments of the invention use measurements available only at one end of the faulty feeder section. In some embodiments the measurement sensor might be available only at the upstream measuring point. With only one-ended measurement available, one-ended fault location algorithm is used to determine the fault location in an event of multi-phase fault.

In some embodiments, the faulted section in a distribution circuit is identified using a root-mean-square (RMS) current measured at each switch along a mainline. The switch measures the fault current for any downstream fault and indicates no fault current when the fault is upstream from the switch. Some embodiments of the invention determine the faulty section by scanning the fault currents measured by each switch with sensor along the feeder.

Some embodiments of the invention identify the type of faulted line, i.e. fault at the mainline, or a service drop or service lateral to a customer. These embodiments take advantage from the prediction of the fault voltages at each bus along the mainline using the measurements obtained from upstream and downstream switches. The voltage and current measured at the upstream switch is used to obtain the voltages and currents at each bus along the mainline of the faulted feeder section using three-phase circuit analysis. Similarly the voltage and current recorded at the downstream switch is used to calculate another set of voltage and current readings at each bus of the faulted feeder section. Both set of voltages are used by embodiment to identify the type of fault.

Some embodiments of the invention are based on a realization that for faults along the mainline, the voltage and current measurements are available at both upstream and downstream switches from sensors. The embodiments use the voltage measurements available at both switches to calculate two sets of voltages at each bus along the main line of the faulty feeder section using three-phase circuit analysis. The two sets of voltages along the mainline are used to determine the faulty line segment. One embodiment uses an exact line model thereby avoiding any chance of error in estimated fault location due to line modeling parameters. A two-ended fault location algorithm is also deployed to determine the accurate fault location.

In some fault cases, measurements are available only at the switch upstream from the fault location. Also for the fault in one of the laterals of a feeder section with two-ended measurements, the voltage determined using both measurements at the bus connected to the lateral can be regarded only one measurement available for the fault location calculation. Some embodiments use an iterative one-ended fault location method to determine an accurate fault location. Because a lateral section can include multiple line segments with several load taps, the fault location method is implemented sequentially for each line segment.

Some embodiments are based on an observation that the exact load at each load bus is unknown, and estimate a load variation parameter using the pre-fault voltage and current measured at the feeder section under nominal load condition and under the current loading condition. The load variation parameter is updated in a small step and fault location algorithm is executed for each updated load variation parameter. The method is repeated until an accurate fault location, estimate is obtained.

Accordingly, one embodiment of the invention discloses a method for determining a location of a fault in an ungrounded power distribution system, wherein the power distribution, system includes a set of feeders connected to a substation, wherein each feeder includes a set of feeder sections, wherein each feeder section starts with an upstream switch and includes a set of loads connected by line segments and each line segment includes an upstream bus and a downstream bus, wherein the fault is a multi-phase fault including one of a phase-to-phase fault, a double-phase-to-ground fault and a three-phase fault. The method includes determining, for a feeder, a furthest feeder section with a current at an upstream switch above a threshold as a faulty feeder section; determining a faulty line as a lateral starting from a first bus of the faulty feeder section if the faulty feeder section lacks a downstream switch, as a lateral starting from a faulty bus on a mainline of the faulty feeder section between the upstream and the downstream switches of the faulty feeder section if a voltage of the faulty bus determined based on measurements of the upstream switch approximately equals a voltage of the faulty bus determined based on measurements of the downstream switch, or as a the mainline; determining the location of the fault at the first bus or at the faulty bus if the lateral has only one bus; determining, if the faulty line is the lateral and the fault is the phase-to-phase fault or the double-phase-to-ground fault, the location, of the fault at a first point on an un-faulty phase of the lateral where a fault current equals a load current; determining, if the faulty line is the lateral and the fault is the three-phase fault, the location of the fault at a point with a difference between imaginary parts of equivalent fault impedances at three phases below a threshold; and determining, if the faulty line is the mainline, a faulty segment of the faulty line between an upstream bus and a downstream bus having voltages with substantially opposite phase angles, and determining the location of the fault at a point partitioning the faulty segment on two sub-segments with a ratio of lengths determined based on the voltages at the upstream and the downstream buses. The steps of the method are implemented using a processor.

Another embodiment discloses a method for determining a location of a fault in an ungrounded power distribution, system, wherein, the power distribution system includes a set of feeders connected to a substation, wherein each feeder includes a set of feeder sections, wherein each feeder section starts with an upstream switch and includes a set of loads connected by line segments and each line segment includes an upstream bits and a downstream bus, wherein the fault is a multi-phase fault including one of a phase-to-phase fault, a double-phase-to-ground fault and a three-phase fault. The method includes determining, for a feeder, a furthest feeder section with a current at an upstream switch above a threshold as a faulty feeder section; determining a faulty line as a lateral starting from a first bus of the faulty feeder section if the faulty feeder section lacks a downstream switch, as a lateral starting from a faulty bus on a mainline of the faulty feeder section between the upstream and the downstream switches of the faulty feeder section if a voltage on the bus determined based on measurements of the upstream switch approximately equals a voltage of the bus determined based on measurements of the downstream switch, or as the mainline; determining the location of the fault on a faulty line segment using a two-ended fault location method, if the faulty line is the mainline; and determining the location of the fault on the faulty line segment using a one-ended method if the faulty line is the lateral.

Yet another embodiment disclose a system for determining a location of a fault, in an ungrounded power distribution system, wherein the power distribution system includes a set of feeders connected to a substation, wherein each feeder includes a set of feeder sections, wherein each feeder section starts with an upstream switch and includes a set of loads connected by line segments and each line segment includes an upstream bus and a downstream bus, wherein the fault is a multi-phase fault including one of a phase-to-phase fault, a double-phase-to-ground fault and a three-phase fault. The system includes at least one processor configure for determining, for a feeder, a furthest feeder section with a current at an upstream switch above a threshold as a faulty feeder section; determining a faulty line as a lateral starting from a first bus of the faulty feeder section if the faulty feeder section lacks a downstream switch, as a lateral starting from a faulty bus on a mainline of the faulty feeder section between the upstream and the downstream switches of the faulty feeder section if a voltage on the bus determined based on measurements of the upstream switch approximately equals a voltage of the bus determined based on measurements of the downstream switch, or as the mainline; determining the location of the fault at the first bus or at the faulty bus if the lateral has only one bus; determining, if the faulty line is the lateral and the fault is the phase-to-phase fault or the double-phase-to-ground fault, the location of the fault at a first point on an un-faulty phase of the lateral where a fault current equals a load current; determining, if the faulty line is the lateral and the fault is the three-phase fault, the location of the fault at a point with a difference between imaginary parts of equivalent fault impedances at three phases below a threshold; and determining, if the faulty line is the mainline, a faulty segment of the faulty line between an upstream bus and a downstream bus having voltages with substantially opposite phase angles, and determining the location of the fault at a point partitioning the faulty segment on two sub-segments with a ratio of lengths determined based on the voltages at the upstream and the downstream buses.

DETAILED DESCRIPTION OF THE PREFERRED EMBODIMENTS

Ungrounded Distribution Systems and Multi-Phase Fault Location Analysis

Figure 1:
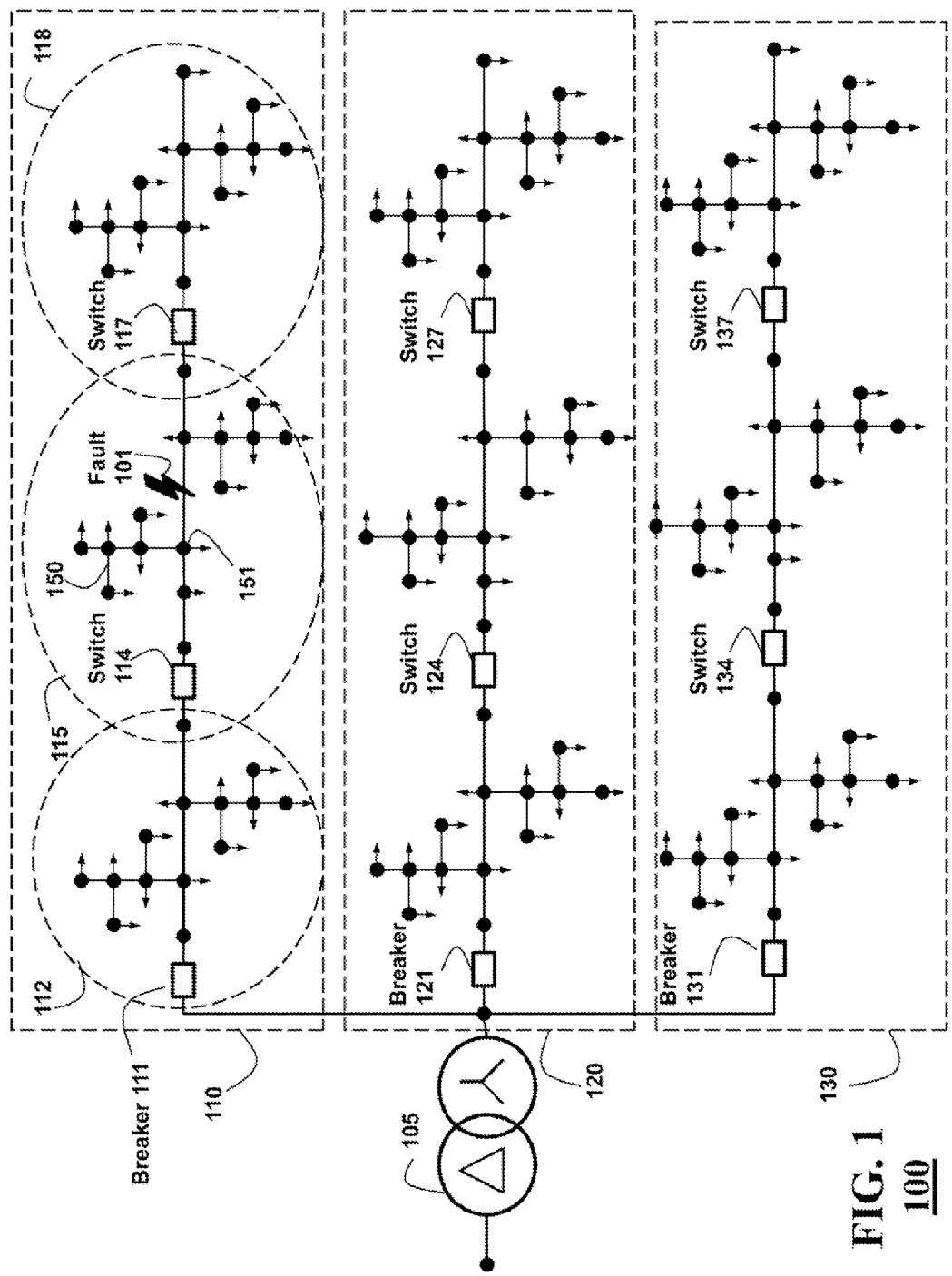
FIG. 1 is a schematic of an exemplar ungrounded distribution system used by some embodiments of invention.

FIG. 1 shows an example of an ungrounded power distribution system 100 with a location 101 of a fault. The power distribution system includes a set of feeders connected to a substation. Each feeder includes a set of feeder sections; each feeder section starts with an upstream switch and includes a set of loads connected by line segments. Each line segment includes an upstream bus and a downstream bus. The fault is a multi-phase fault including one of a phase-to-phase fault, a double-phase-to-ground fault and a three-phase fault.

For example, the power distribution system 100 includes a distribution substation in which a three-phase transformer 105 receives electric power from a transmission system, and provides the power for downstream feeders. The windings of the transformer 105 are ungrounded, either using ungrounded WYE or DELTA connection. For example, in the FIG. 1, the primary winding of the transformer uses the DELTA connection, and secondary winding uses the ungrounded WYE connection. The feeder transfers powers to the loads through three-phase three-wire lines. All loads can be DELTA connected. Each feeder has one feeder breaker, and several switches with sensors. Both the breakers and switches are measured with three phase-to-ground voltages and three phase currents In the example of FIG. 1, the transformer 105 is connected to three feeders, a feeder 110, a feeder 120 and a feeder 130. Each feeder can include one feeder breaker at its root, e.g., breakers 111, 121, and 131. The feeders can also include switches defining sections of the feeders. For example, the feeder 110 includes a switch 114 and a switch 117. The feeder 120 includes a switch 124 and a switch 127. The feeder 130 includes a switch 134 and a switch 137.

According to the location of switching and measuring devices, a feeder can be partitioned into several feeder sections. For example, the feeder 110 can be partitioned into three feeder sections, section 112, section 115, and section 118. The feeder section 112 includes all the line segments or devices between the breaker 111, and the switch 114. The section 115 is defined by all the line segments or devices between the switch 114, and the switch 117. The feeder section 118 is defined as all line segments or devices downstream to the switch 117.

Figure 2A:
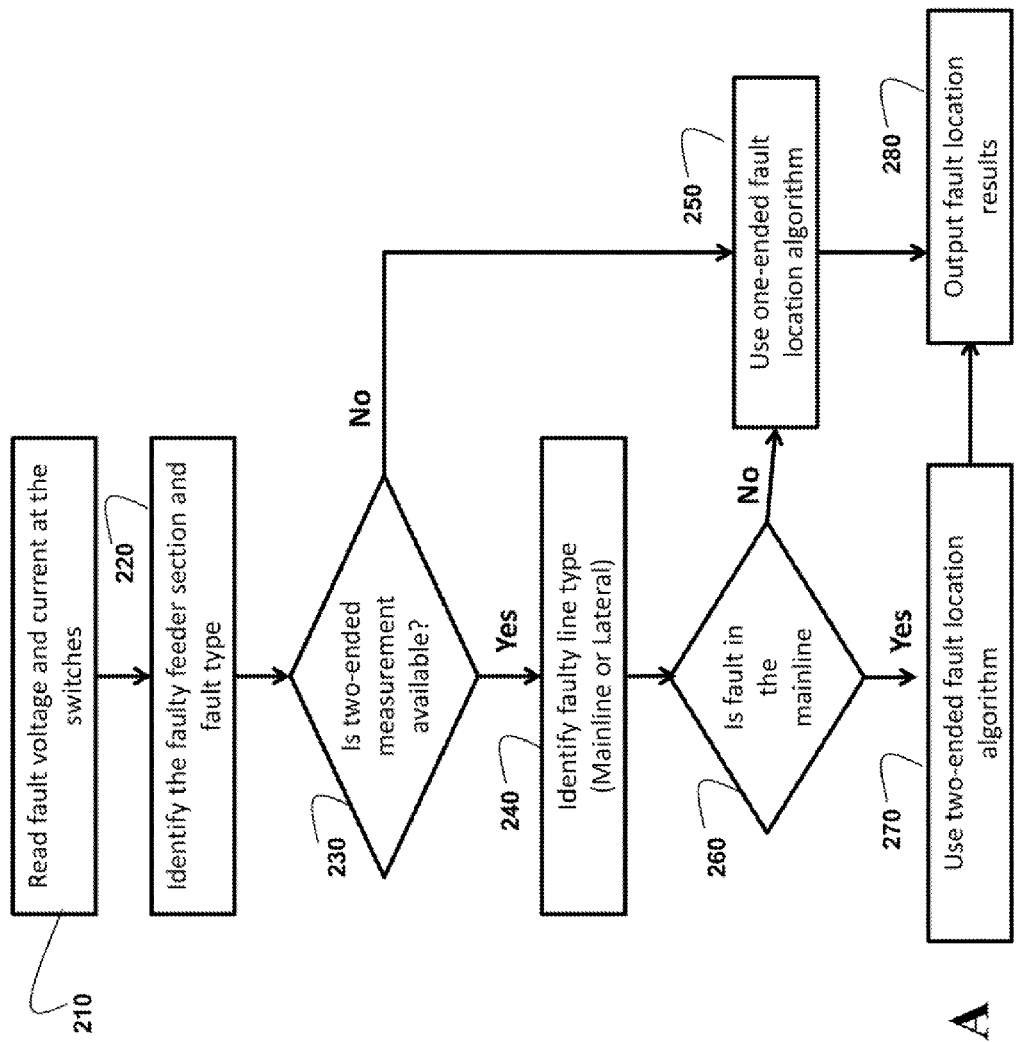
FIG. 2A and FIG. 2B are block diagrams of methods for fault location analysis according to some embodiments of invention.

FIG. 2A shows a block diagram of a method, for locating a multi-phase fault in an ungrounded distribution system. For the mainline of a feeder section with two-ended measurements, a two-ended fault location algorithm is used. The two-ended algorithm is applicable to all general cases of multi-phase faults, including phase-to-phase, double phase to ground, and three-phase faults. For the service laterals when the two-ended measurements are not available, a one-ended fault location algorithm is used. Separate one-ended algorithms are used for double-phase-to-ground, phase-to-phase and three-phase faults respectively.

After measuring the voltage and current at the breakers and switches during the fault 210, the method first identifies the fault type and faulty feeder section 220 and checks if there are two-ended measurement available 230 for the faulty feeder section. If there are two-ended measurements available, the faulty line is further determined to be a line segment on the mainline, or at a lateral 240.

Based on the type of fault line, the method uses either a two-ended fault location algorithm 270 or a one-ended fault location algorithm, 250 to determine the fault location. If there is only one-ended measurement available, then the one-ended fault location algorithm 250 is used.

Notably, identifying the faulted line type before detailed analysis of fault locations makes the fault locating process fester and less computationally complex. Also, both two-ended and one-ended fault location methods described herein make no assumption about the fault impedance, and hence are suitable for fault location analysis of both bolted faults and impedance faults.

Figure 2B:
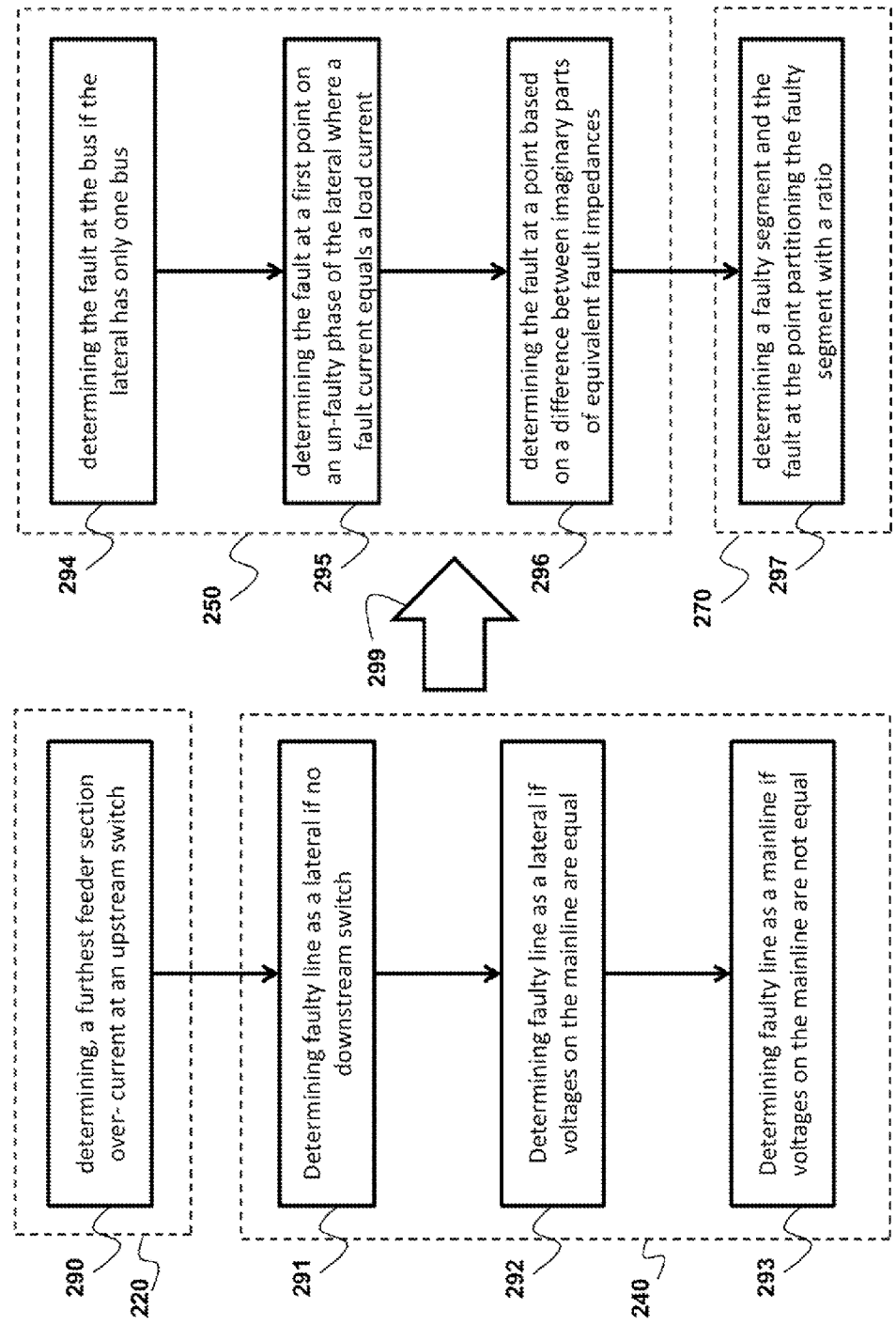

FIG. 2B shows a block diagram of a method for determining the location of the fault according to one embodiment of the invention employing the principles of described for FIG. 2A. For example, the faulty feeder section is determined 290 as a furthest feeder section with a current at an upstream switch above a threshold. For example, for the fault 101, the upstream switch 114 of the section 115 and the upstream switch 111 of the section 112 would be over-current, i.e., the measurements of the current on those switches are unusually high due to the fault.

However, because the section 115 is further from the beginning of the feeder 110 than the section 112, the section 115 is selected as the faulty feeder section.

Next, the embodiment identify 240 the type of the faulty line using one or combination of the tests 291-293. For example, the embodiment; determines 291 a faulty line as a lateral starting from a first bus of the faulty feeder section if the faulty feeder section lacks a downstream switch. For example, if the fault is in the section 118, the entire lateral starting from the first bus of the switch 117 is selected, because for this section only one type of measurement of the switch 117 is available.

Similarly, the embodiment determines 292 a faulty line as a lateral starting from a faulty bus on a mainline of the faulty feeder section between the upstream and the downstream switches of the faulty feeder section if a voltage on the bus determined based on measurements of the upstream switch approximately equals a voltage of the bus determined based on measurements of the downstream switch. For example, if the fault is in the lateral 150, the faulty bus is the bus 151 on the mainline between the upstream switch 114 and the downstream switch 117. In this case, there is also only one equivalent of the measurement for the faulty bus 151 of the mainline, and thus the type of the faulty line is the lateral.

Some embodiments determine a first set of voltages at each bus on the mainline based on measurements of the upstream switch, e.g., the switch 114, using a three-phase circuit analysis and determine a second set of voltages at each bus on the mainline based on measurements of the downstream switch, e.g., the switch 117, using the three-phase circuit analysis. Next, the embodiments compare the voltages in the first set with the voltages in the second set to check an equality of corresponding voltages in the first and the second sets.

The result of the comparison can be used in the above determination 292 and in the determination 293. For example, The embodiments determine 293 that the fault is in the mainline if the two sets of voltages determined using both switches are not approximately equal, i.e., the difference is less than a threshold, for any of the buses along the main feeder.

Various embodiments use the knowledge of the faulty feeder section and the type of the faulty line to select 299 the appropriate method for determining the location of the fault. If the faulty line is lateral, one-ended fault location method 250 is used. For example, if the lateral has only one bus, one embodiment determines 294 the location of the fault at the first bus or at the faulty bus. If the faulty line is the lateral and the fault is the phase-to-phase fault or the double-phase-to-ground fault, one embodiment determines 295 the location of the fault at a first point on an un-faulty phase of the lateral where a fault current equals an equivalent load current. Also, if the faulty line is the lateral and the fault is the three-phase fault, one embodiment determines 296 the location of the fault at a point with a difference between imaginary parts of equivalent fault impedances at three phases below a threshold, as described below.

If the faulty line is the mainline, some embodiments use two-ended fault location method 270. For example, one embodiment determines 297 a faulty segment of the faulty line between an upstream bus and a downstream bus having voltages with substantially opposite phase angles, and determining the location of the fault at a point partitioning the faulty segment on two sub-segments with a ratio of lengths determined based on the voltages at the upstream and the downstream buses. This embodiment takes advantage from the measurements provided by both the upstream and downstream switches of the mainline.

Identify the Faulted Feeder Section and Fault Type

In one embodiment, the faulted feeder section is determined based on the phase current measurements at the switches at its boundaries, and the fault type is determined using both current and voltage measurements.

The faulted feeder section identification facilitates the fault location in many ways. First, after the faulty section is identified, the fault location process runs only for that section, and not for the entire distribution system, thus making fault location faster. Second, in case of faults on multiple feeders, all faulty sections could be identified using this approach and locations for all the faults can be determined.

For a feeder section, if there are over-currents occurring on multiple phases at its upstream switch, but not at its downstream switches, then there is a multi-phase fault in the feeder section. The phases that have over-currents are the faulted phases.

A phase x is determined as having over-current, if the following condition is met;

$$\frac{|I_{p,x}|}{I_{p,x}^{rated}} \geq \overline{I} \, x \in \{a,b,c\}, \quad (1)$$

wherein $|I_{p,x}|$ and $I_{p,x}^{rated}$ are the magnitude of measured current, and the rated current on phase x at the switch p, $\overline{I}$ is the threshold of current ratio of measured current over rated current used for over current status determination. For example, the threshold $\overline{I}$ can be set as 3.0.

If there are three phases having over-currents, then the fault is a three-phase fault. If there are two phases having over currents, then the fault is either a phase-to-phase fault, or a double-phase-to-ground fault. For a two-phase fault if there is an over-voltage on the un-faulted phase, the fault is a double-phase-to-ground fault; otherwise it is a phase-to-phase fault.

A phase x is determined as having over-voltage, if the following condition is met:

$$|V_{p,x}| \geq \overline{V} x \in \{a,b,c\} \quad (2)$$

Wherein $|V_{p,x}|$ is the magnitudes of voltages measured at bus p on the phase x, and $\overline{V}$ is the threshold of voltage magnitude used for over voltage status determination. For example, the threshold $\overline{V}$ can be set as 1.40 per unit.

Identify Type of the Faulted Line

A feeder section defined by the upstream and downstream switches with sensors is a two-ended feeder section in the invention. The examples of the two-ended feeder section include a section 112 and 115. The fault can be occurring either at the mainline of the section, i.e., the shortest path between two switches, or the laterals of the section, i.e., the portion of feeder section started at the bus on the mainline.

Some embodiments identify the type of faulted line based on the estimation of the fault voltages at each bus along the mainline using the measurements obtained from the two switches. The voltage and current measured at the upstream switch is used to determine the first set of the voltages and currents at each bus along the mainline of the faulted section using three-phase circuit analysis. Similarly, the voltage and current measured at the downstream switch is used to determine the second set of fault voltages and currents at each bus of the faulted section. Both set of voltages are compared to identify the type of faulty line.

Step-1:

Calculating the fault voltages and currents using the upstream switch (switch-A) measurements.

Figure 3:
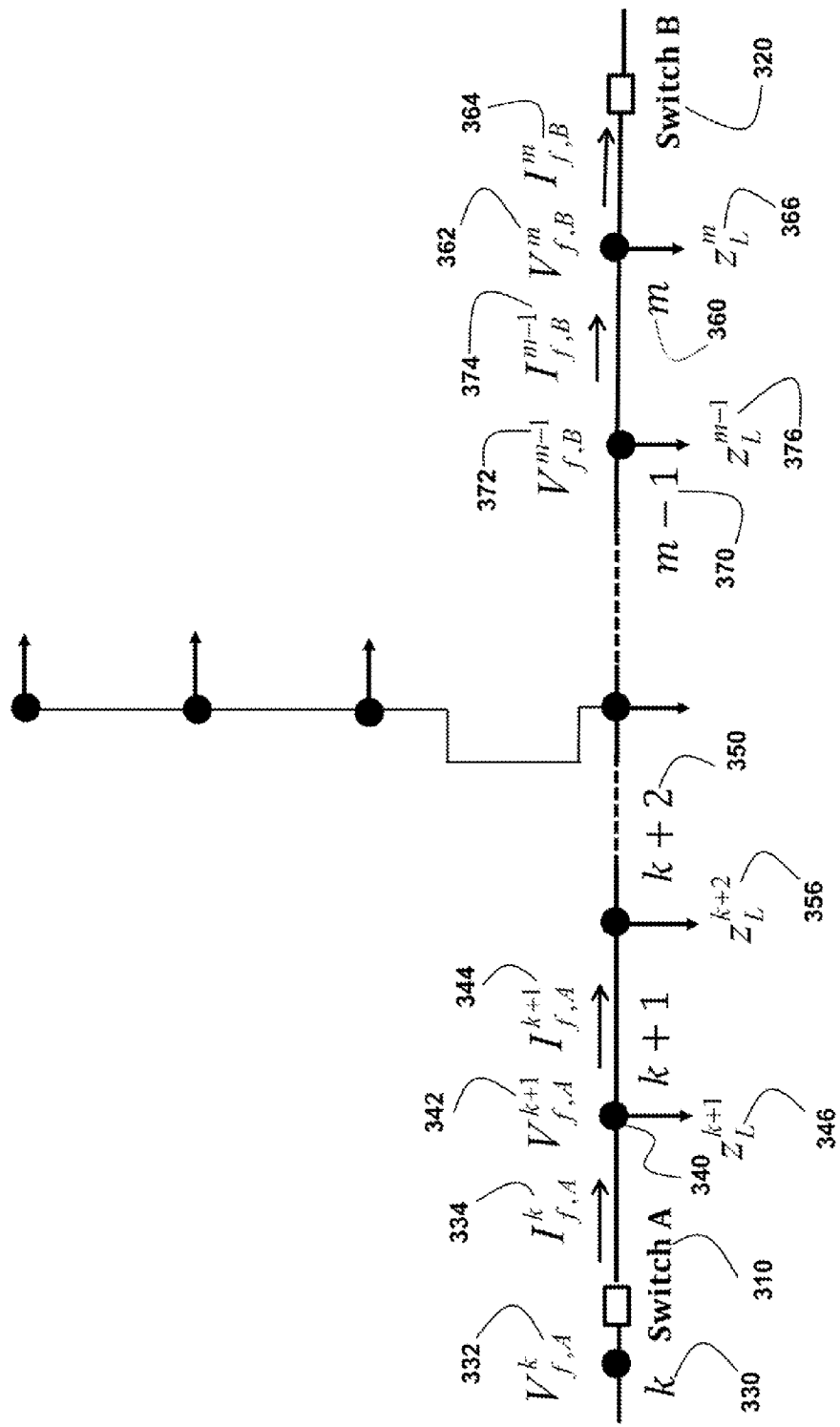
FIG. 3 is a schematic of a feeder section with no laterals connected to the buses (k+1) and (m−1) according to some embodiments of invention.
Figure 4:
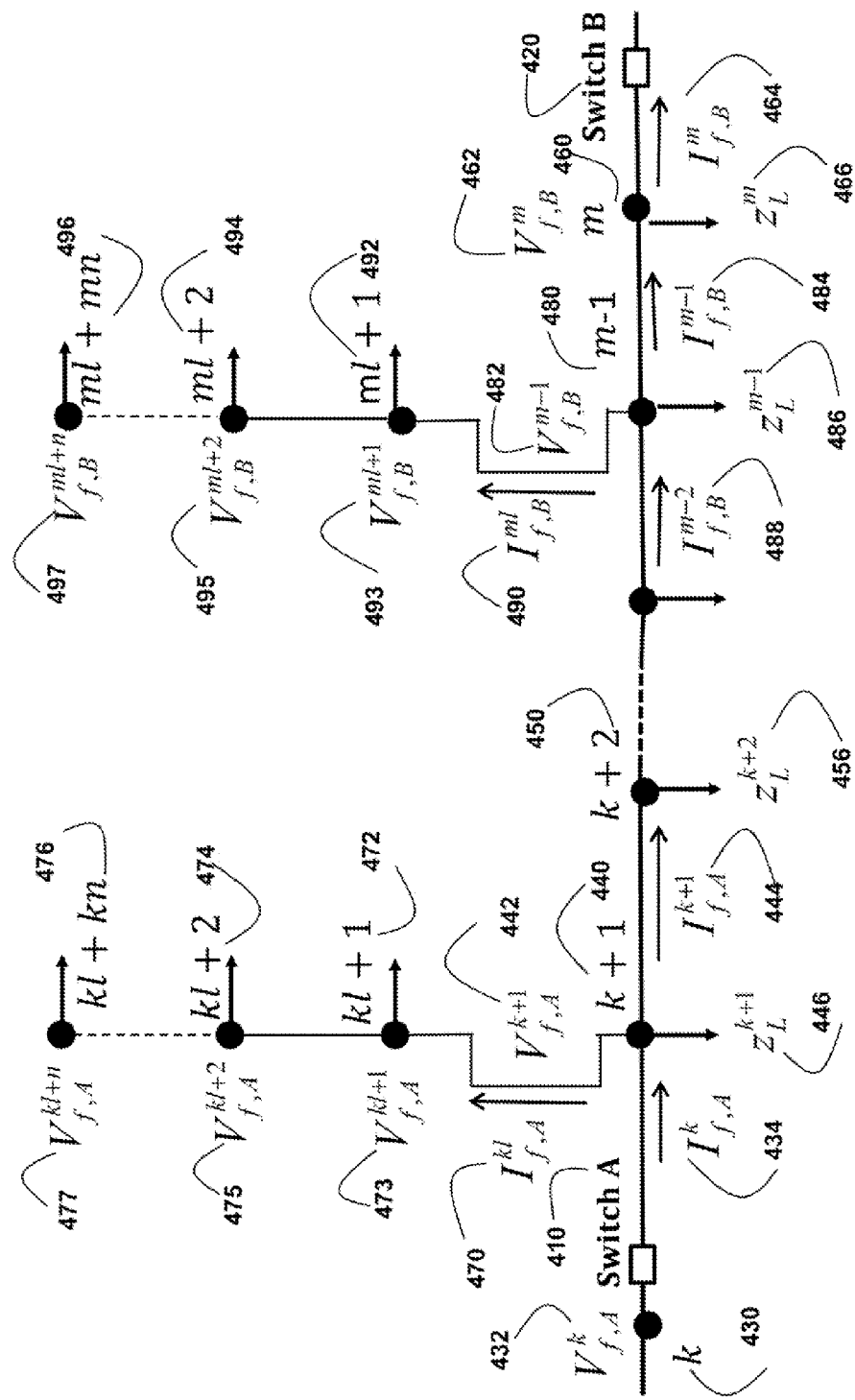
FIG. 4 is a schematic of a feeder section with laterals connected to the buses (k+1) and (m−1) according to some embodiments of invention.

FIGS. 3 and 4 shows two examples for calculating voltage and current of a two-ended feeder section. In FIG. 3, bus k+1 340 is not connected with any laterals. In FIG. 4, bus k+1 440 is connected with a lateral.

Let, $V_{f,A}^k$, $I_{f,A}^k$ be the voltage and current measured at the upstream switch (Switch-A) during the fault. While calculating voltage and current at bus k+1 two cases can arise. One case is that bus k+1 is not connected to a lateral as shown in FIG. 3, and the other is bus k+1 is connected to a lateral as shown in FIG. 4.

If bus k+1 is not connected to a lateral as shown in FIG. 3, using the impedance of line segment between bus k and k+1, $z_{ll}^k$, and load impedance matrix at bus k+1, $z_L^{k+1}$, the voltage and current at bus k+1 are determined according to:

$$V_{f,A}^{k+1} = V_{f,A}^k - I_{f,A}^k z_{ll}^k, \quad (3)$$

$$I_{f,A}^{k+1} = I_{f,A}^k - (z_L^{k+1})^{-1} V_{f,A}^{k+1}, \quad (4)$$

where, $V_{f,A}^{k+1}$ and $I_{f,A}^{k+1}$ are the vectors of voltages at bus k+1 and currents flowing from bus k+1 to bus k+2 determined using the measurements at the upstream switch A.

If bus k+1 is connected to a lateral as shown in FIG. 4, the bus k+1 voltage calculation is same as the previous case. Hence, $V_{f,A}^{k+1}$ is given by equation (3). However to calculate the current flowing in next line segment between bus k+1 and bus k+2, the current flowing in the lateral $I_{f,A}^{kl}$ is also determined.

Thus, current $I_{f,A}^{k+1}$ is given by equation (5)

$$I_{f,A}^{k+1} = I_{f,A}^{k} - (z_L^{k+1})^{-1} V_{f,A}^{k+1} - I_{f,A}^{kl}, \quad (5)$$

where, $I_{f,A}^{kl}$ is the currents flowing into the lateral fed by bus k+1.

The $I_{f,A}^{kl}$ can be determined based on the relationship between the bus injection currents and bus voltages of all the buses in the lateral. In the example of FIG. 4, the lateral fed by bus k+1 includes a set of buses, bus kl+1, kl+2, ..., kl+kn.

The voltage and current relationship for the lateral can be expressed as:

$$\begin{bmatrix} I_{f,d}^{kl} \\ 0 \\ \vdots \\ 0 \end{bmatrix} = Y_{l,k+1} \begin{bmatrix} V_{f,A}^{kl+1} \\ V_{f,A}^{kl+2} \\ \vdots \\ V_{f,A}^{kl+kn} \end{bmatrix}, \quad (6)$$

where, $Y_{l,k+1}$ is the bus admittance matrix determined based on the impedance of line segments and load impedances for the lateral connected to bus k+1. Only bus k+1 has current injection and all other buses do not have injected currents.

Regrouping the set of buses into two sets, one only includes bus k+1, and the other includes all buses except bus k+1, and the lateral admittance matrix $Y_{l,k+1}$ can also portioned as follows:

$$Y_{l,k+1} = \begin{bmatrix} Y_{l,k+1}^{11} & Y_{l,k+1}^{12} \\ Y_{l,k+1}^{21} & Y_{l,k+1}^{22} \end{bmatrix}, \quad (7)$$

where, $Y_{l,k+1}^{11}$ and $Y_{l,k+1}^{22}$ are the self-admittance matrices of the first and second set of buses, $Y_{l,k+1}^{12}$ and $Y_{l,k+1}^{21}$ are the mutual-admittance matrices between the first and second sets of buses respectively.

Based on Equations (6) and (7), the vector of currents on the lateral can be determined as:

$$I_{f,A}^{kl} = \{Y_{l,k+1}^{11} - Y_{l,k+1}^{12}(Y_{l,k+1}^{22})^{-1} Y_{l,k+1}^{21}\} V_{f,A}^{k+1} \quad (8)$$

Step-2:

Determining fault voltages and currents using the downstream switch (switch-B) measurements.

A similar set of calculations are repeated to obtain voltage and current at each bus using the measurements obtained from downstream switch (switch-B). Let, $V_{f,B}^{m}$, $I_{f,B}^{m}$ be the voltage and current measured at the switch-B, during fault. Similar to the previous case while calculating voltage and current at bus m-1 two cases can arise.

If bus m-1 is not connected to a lateral as shown in FIG. 3, using the line impedance between bus m and bus m-1, $z_{ll}^{m-1}$, and load impedance matrix at bus m, $z_L^m$, the voltages at bus m-1 and currents flowing out of bus m-1 is determined as:

$$I_{f,B}^{m-1} = I_{f,B}^{m} + (z_L^{m})^{-1} V_{f,B}^{m}, \quad (9)$$

$$V_{f,B}^{m-1} = V_{f,B}^{m} + I_{f,B}^{m-1} z_{ll}^{m-1}, \quad (10)$$

where, $V_{f,B}^{m-1}$ and $I_{f,B}^{m-1}$ are the vectors of voltages at bus m-1 and currents flowing from bus m-1 to bus m determined using the measurements at the downstream switch B.

If bus m-1 is connected to a lateral as shown in FIG. 4, $I_{f,B}^{m-1}$ and $V_{f,B}^{m-1}$ are determined using Equations (9) and (10). However, calculation of current flowing out of bus m-2, $I_{f,B}^{m-2}$, requires current flowing in the lateral $I_{f,B}^{ml}$. Current $I_{f,B}^{m-2}$ is given by $$I_{f,B}^{m-2} = I_{f,B}^{m-1} + (z_L^{m-1})^{-1} V_{f,B}^{m-1} + I_{f,B}^{ml} \quad (11)$$

The current $I_{f,B}^{ml}$ can be determined using the same method as discussed for upstream switch measurement. Following the same procedure, the current $I_{f,B}^{ml}$ is determines by (12):

$$I_{f,B}^{ml} = \{Y_{l,m-1}^{11} - Y_{l,m-1}^{12}(Y_{l,m-1}^{22})^{-1} Y_{l,m-1}^{21}\} V_{f,A}^{m-1}, \quad (12)$$

where, $Y_{l,m-1}^{11}$ and $Y_{l,m-1}^{22}$ are the self-admittance matrices of the first and second set of buses, $Y_{l,m-1}^{12}$ and $Y_{l,m-1}^{21}$ are the mutual-admittance matrices between the first and second sets of buses, and the first set of buses includes only bus m-1, and the second set of buses include all bus in the lateral except bus m-1.

The equations are recursively used to calculate voltages at each bus.

Step-3:

Determining the type of faulty line.

Based on the voltage and current recorded at both upstream and downstream switches, the voltages at each bus along the mainline are determined. Thus, two sets of voltages are available at any bus n, $V_{f,A}^{n}$ and $V_{f,B}^{n}$.

Figure 5:
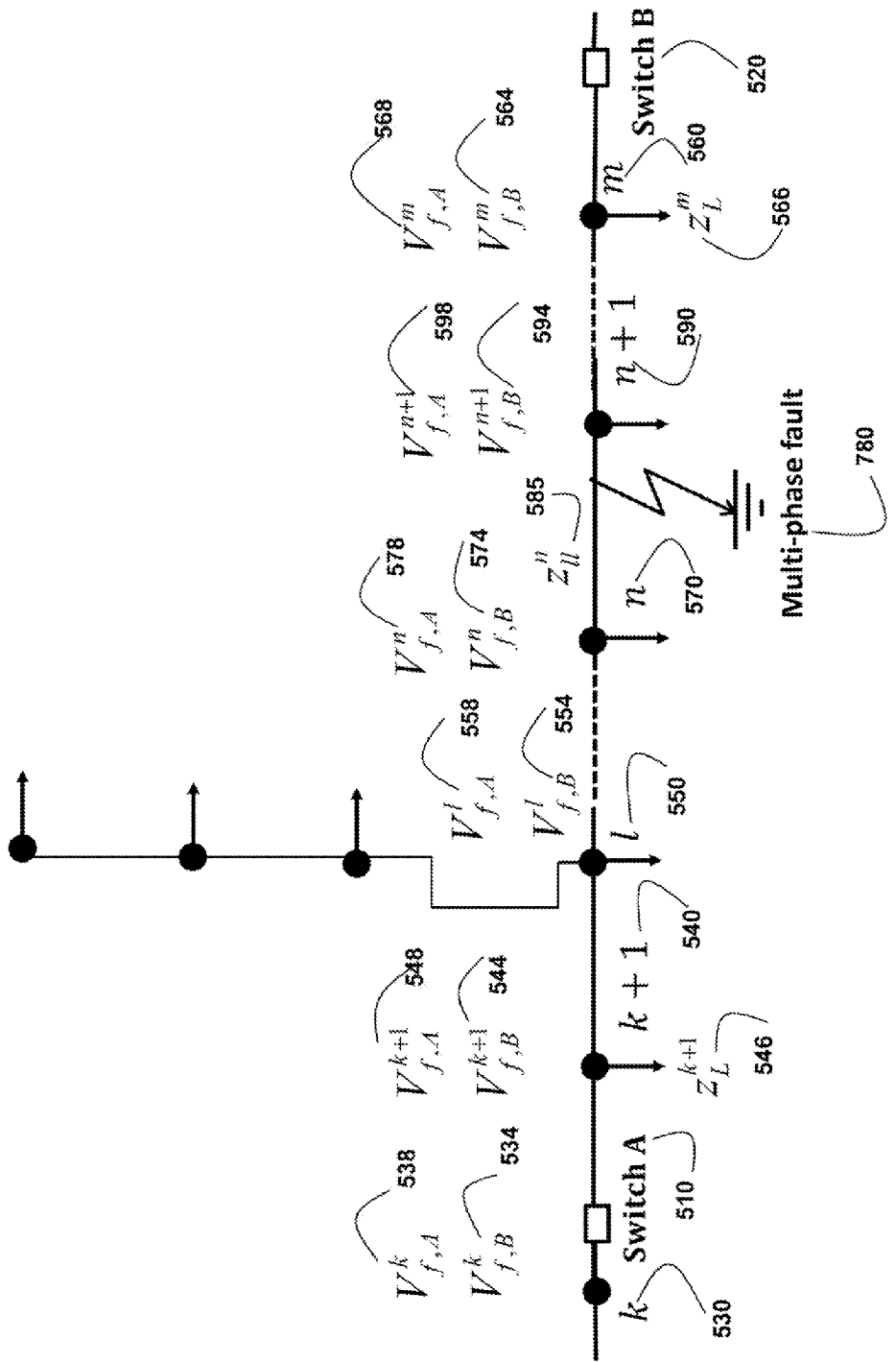
FIG. 5 is a schematic of a two-ended feeder section calculating voltage and current for each bus using measurements from both switches according to some embodiments of invention.
Figure 6:
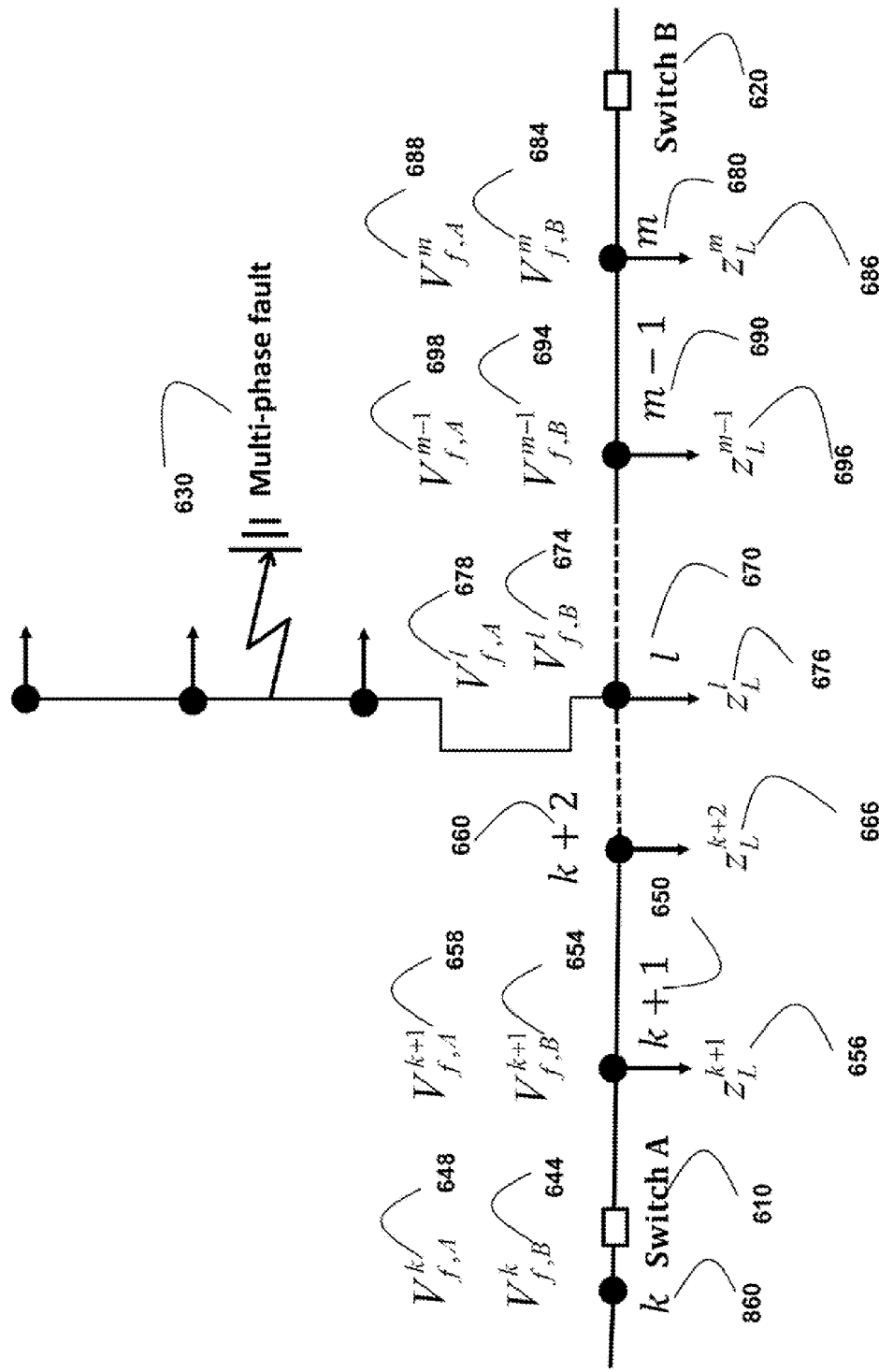
FIG. 6 is a schematic of a feeder section with a fault in the lateral.

FIG. 5 and FIG. 6 show two example of the fault location. If the fault is in the mainline, as shown in FIG. 5, the voltages at any bus n, $V_{f,A}^{n}$ and $V_{f,B}^{n}$ corresponding to faulty phases will not be equal. Therefore, each bus along the mainline will satisfy (13) for a small threshold δ, for example, 0.0001.

$$\|V_{f,A}^{n} - V_{f,B}^{n}\| > \delta \quad (13)$$

If the fault is in the bus or in the lateral connected to a bus, as shown in FIG. 6, the bus voltage at the bus l, determined during fault condition using both switch-A and switch-B measurements will satisfy (14) for a small threshold δ:

$$\|V_{f,A}^{l} - V_{f,B}^{l}\| < \delta \quad (14)$$

This condition implies that the voltages determined at the faulty bus or at the lateral connected to the faulty bus using the two measurements are approximately equal. If (14) is satisfied for bus l, then fault is either at bus l, or at the lateral connected to bus l.

Determining Fault Location

For the mainline of a two-ended feeder section, the voltage and current readings are available at both ends. For the laterals and the last section of the feeder only one measurement is available. Therefore, based on available voltage and current measurements, both two-ended and one-ended algorithms are used.

Fault Location of Faults at the Mainlines

Figure 7:
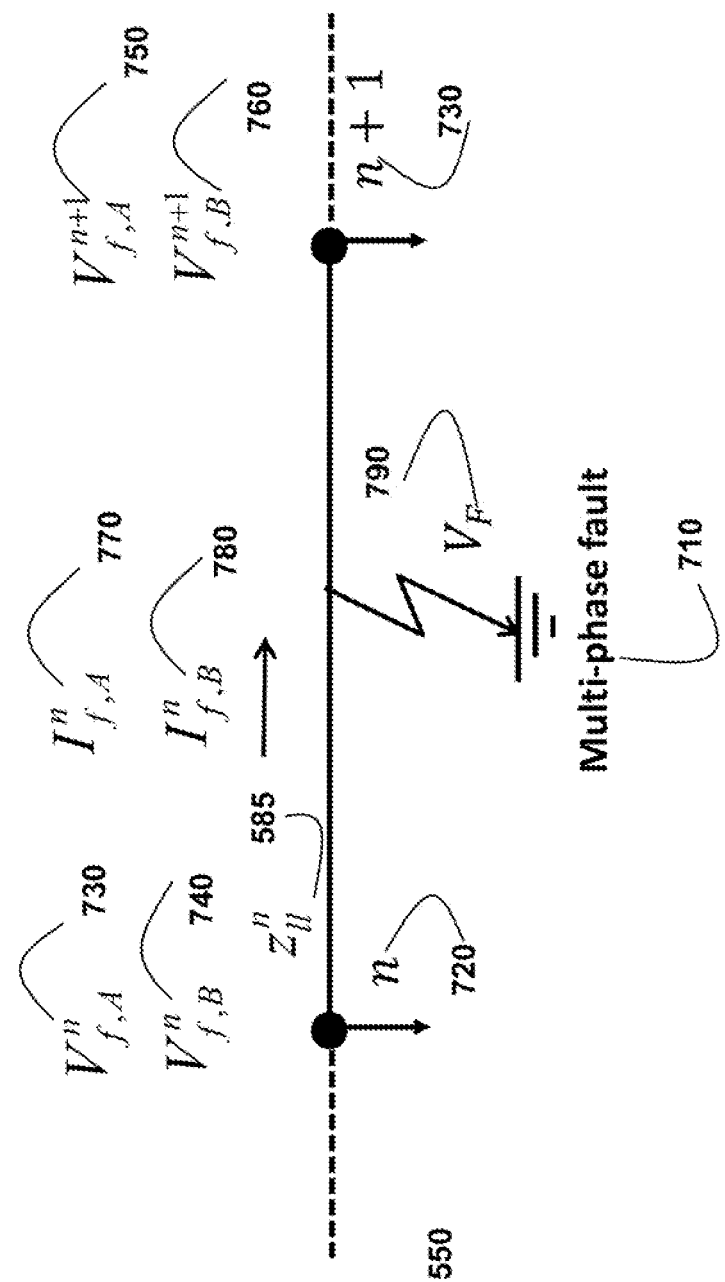
FIG. 7 is a schematic of a feeder section with a fault in the mainline.

FIG. 7 shows the fault 710 is in the mainline and between buses n, 720 and n+1, 730. Two sets of voltages and currents are available at both bus n and n+1. Let $V_F$, 790 be the voltage at the fault location. Then, using circuit analysis the following equations are obtained:

$$V_{f,A}^{n} = V_F + dz_{ll}^{n} I_{f,A}^{n}, \quad (15)$$

$$V_{f,B}^{n} = V_F + dz_{ll}^{n} I_{f,B}^{n}, \quad (16)$$

$$V_{f,A}^{n+1} = V_F - (l-d) z_{ll}^{n} I_{f,A}^{n}, \quad (17)$$

$$V_{f,B}^{n+1} = V_F - (l-d) z_{ll}^{n} I_{f,B}^{n}, \quad (18)$$

where, d is the distance from bus n to the fault location, and l is the total length of the line segment between bus n and bus n+1.

Some embodiments of the invention determining the faulty segment having a difference in angle differences of corresponding voltages in the first and the second set determined at the upstream and downstream buses close to 180 degree. For example, Using (15)~(18), for the faulted line segment between bus n and (n+1) we obtain:

$$\frac{(V_{f,A}^{n+1} - V_{f,B}^{n+1})}{(V_{f,A}^{n} - V_{f,B}^{n})} = -\frac{(l-d)}{d}, \quad (19)$$

$$\angle(V_{f,A}^{n+1} - V_{f,B}^{n+1}) - \angle(V_{f,A}^{n} - V_{f,B}^{n}) = \pi. \quad (20)$$

Now, if any two adjacent buses in the main feeder satisfy (20), then the fault is in the line section between buses n and n+1. Once the faulted line segment is identified, (19) is used to calculate the distance to the fault, d. Only the faulted phases are used for (19) and (20).

Fault Location of Faults at the Laterals

If the fault is in one of the laterals, then the voltage determined using both measurements at the bus connected to the lateral, l for a two-ended section will be approximately equal:

$$V_{f,A}^l = V_{f,B}^l = V_f^l \quad (21).$$

Figure 8:
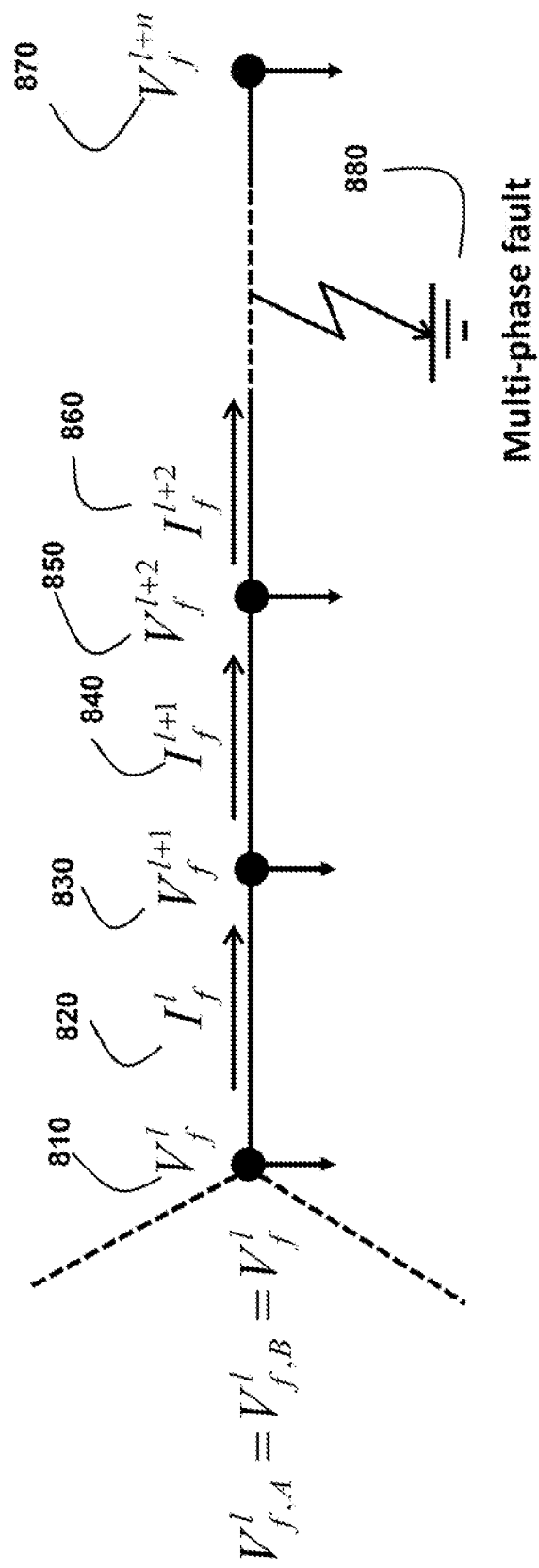
FIG. 8 is a schematic of a line segment with a multi-phase fault.

FIG. 8 shows an example of a lateral having a fault 880. The lateral can include many line segments with several load taps, and, in some embodiments, the fault location is implemented sequentially for one line-segment at a time until the location of the fault is found. The distance to the fault is measured, e.g., with respect to the upstream bus of the line-segment. Two separate methods are used for a double-phase fault (both phase-to-phase and double-phase-to-ground) and a three-phase fault. For example, if the fault is the phase-to-phase fault or the double-phase-to-ground fault, the location of the fault is determined at a first point on an un-faulty phase of the lateral where a fault current equals an equivalent load current. If the fault is the three-phase fault, the location of the fault is determined at a point with a difference between imaginary parts of equivalent fault impedances at three phases below a threshold.

Figure 9:
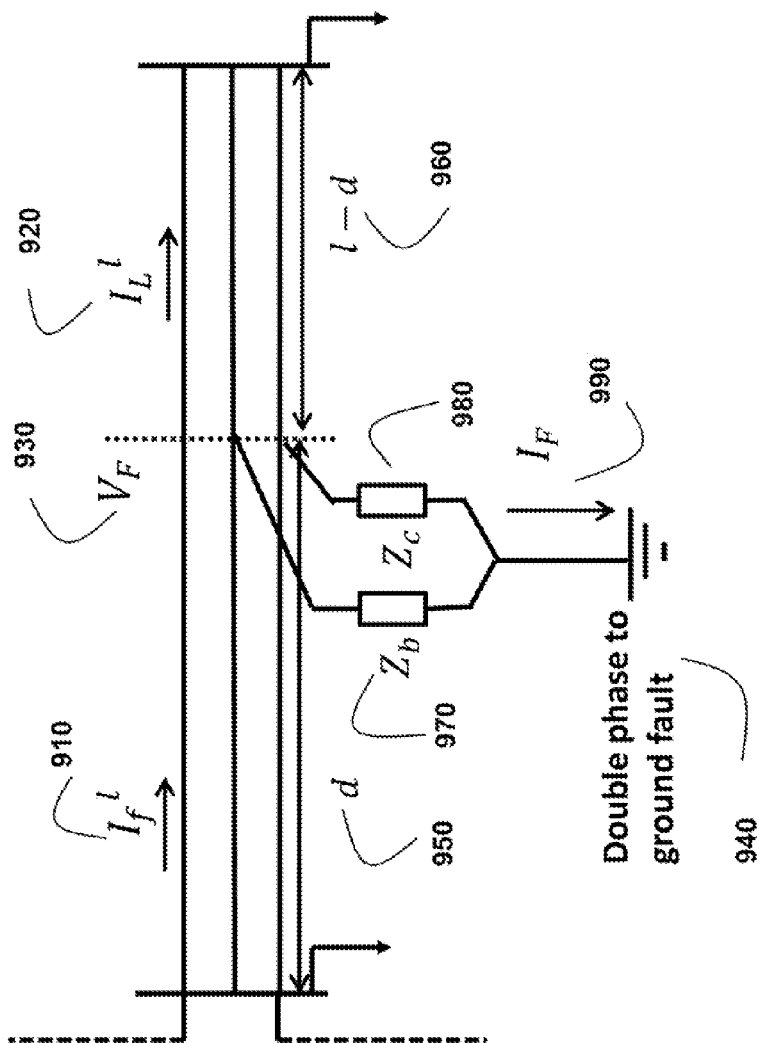
FIG. 9 is a schematic of a faulty line segment with a double-phase-to-ground, fault.
Figure 10:
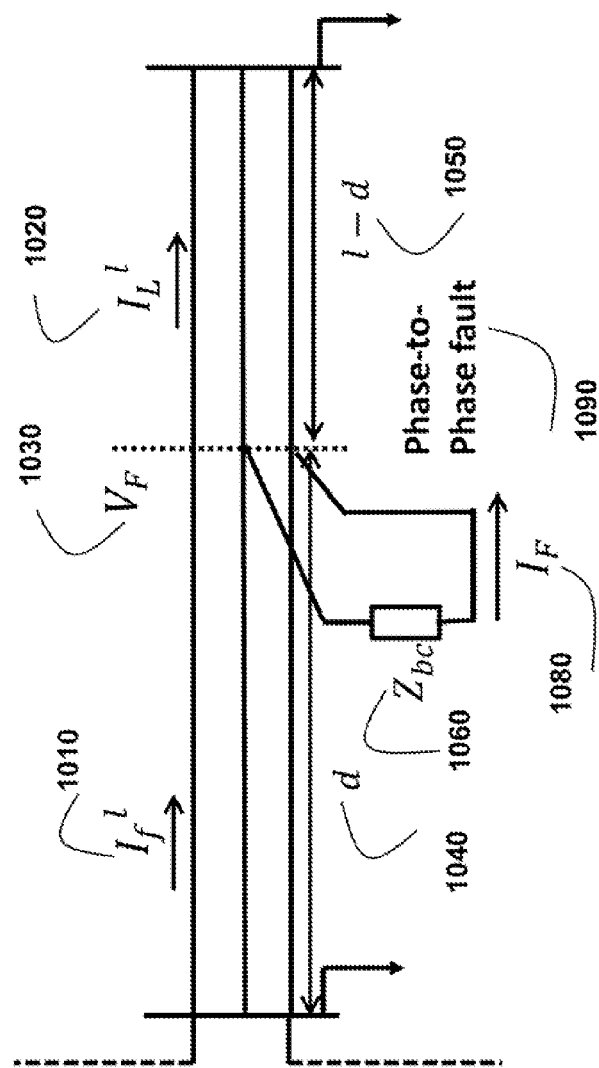
FIG. 10 is a schematic of a faulty line segment with a phase-to-phase fault.
Figure 11:
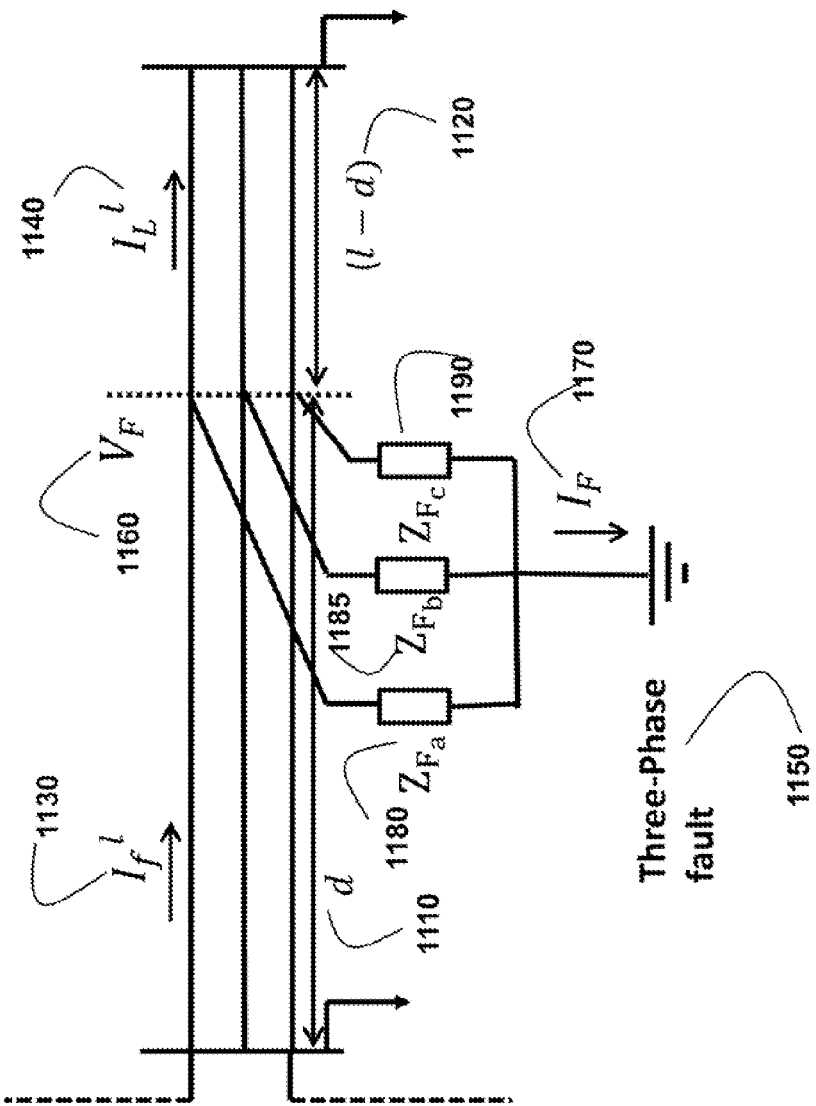
FIG. 11 is a schematic of a faulty line segment with a three-phase fault.

FIGS. 9, 10 and 11 show examples of a double-phase-to-ground fault, phase-to-phase fault and three phase fault. For any multi-phase fault, fault voltage, current and impedance are given as:

$$V_F = V_f^l - I_f^l d z_{ll}^l, \quad (22)$$

$$I_F = I_f^l - I_L^l, \quad (23)$$

$$Z_{F_{a,b,c}} = \frac{V_F}{I_F}, \quad (24)$$

wherein $z_{ll}^l$ is the line impedance of the line segment, $V_F$ is the voltage at the fault location, $I_F$ is the fault current at fault location, $I_f^l$ is the faulted line current flowing in line segment, $I_L^l$ is the load current flowing during the fault condition, $Z_{F_{a,b,c}}$ is the equivalent fault impedance at the fault location.

Locating Double-Phase Faults

As shown FIGS. 9 and 10, for a double-line fault, one of the phases is un-faulted. Let's assume phase b and c are the faulted phases, then phase a is the un-faulted phase. The equivalent load current at phase a will be equal to fault current at phase a as given by (25). While phase b and phase c (faulted phases) load currents are given by (26).

$$I_L^{l,(a)} = I_f^{l,(a)}, \quad (25)$$

$$I_L^l = \frac{v_f^l - dI_f^l z_{ll}^l}{(L_l - d)z_{ll}^l + z_{eq}^{l+1}}, \quad (26)$$

wherein $z_{eq}^{l+1}$ is the equivalent load impedance as seen by the line segment, and determined according to:

$$z_{eq}^{l+1} = \left((z_p^{l+1})^{-1} + (z_L^{l+1})^{-1}\right)^{-1}, \quad (27)$$

$z_L^{l+1}$ is load impedance at bus l+1 and $z_p^{l+1}$ is equivalent line and load impedance downstream bus l+1.

Some embodiments determine load currents for each phase using (26) along a line-segment by varying the distance to fault d. The value of d, for which load current determined for the un-faulted phase using (26) matches with the load current value determined using (25) is the estimated fault location. Next, some embodiments determine distance to the fault location d from upstream switch. Because, d is unknown, an iterative process is used to test variation of d from 0 to the length of the line segment, $L_l$. The step d is determined based on the desired accuracy. The process includes the following steps:

A value of the distance d is set between 0 and $L_l$. Using Equation (26) one embodiment determines the load current corresponding to each phase for each value of d. For un-faulted phase, plot the current difference $I^{var} = \|I_L^{l,(a)} - I_f^{l,(a)}\|$, against d, for the entire length of the line segment, l. Using the plot, the minimal difference, $\min(I^{var})$ for the line segment is determined.

If $\min(I^{var}) < \delta$, i.e., a fault current equals a load current, and minimum value does not correspond to the end of the line segment, then the distance to fault is the corresponding value of the distance d. Otherwise, the fault is in one of the next line segments. The fault voltage and current are determined at the next bus l+1 using Equations (28) and (29):

$$V_f^{l+1} = V_f^l - I_f^l z_{ll}^l, \quad (28)$$

$$I_f^{l+1} = I_f^l - (z_L^{l+1})^{-1} V_f^{l+1} \quad (29)$$

The above steps are repeated, until a first point on an un-faulty phase of the lateral where a fault current equals a load current is found.

Locating Three Phase Fault

As shown in FIG. 11, some embodiments take advantage from an observation that ideally, the fault impedances are resistances, or three phases balanced, then the imaginary parts of equivalent fault impedances at phase a, phase b and phase c are equal to each other, that is $\text{imag}(Z_{F_a}) = \text{imag}(Z_{F_b}) = \text{imag}(Z_{F_c})$, where $Z_{F_a}$, $Z_{F_b}$ and $Z_{F_c}$ are the equivalent fault impedance at the fault location for phase a, phase b, and phase c respectively. Also, load current for each phase corresponding to an assumed fault distance d is given by Equation (26).

Some embodiments determine the load currents for each phase using, e.g., Equation (26) along a line-segment by varying the distance to the fault, d and determine the corresponding fault impedance using, e.g., Equation (24).

Now the value of the distance d that gives minimum difference in three phase reactance is the estimated fault location.

The steps to calculate distance to the fault location, d from upstream switch are as follows: Set d to be a value between 0 and $L_j$; Using (26) calculate the load current corresponding to each phase for each value of d; Using (24) calculate the equivalent fault impedance ($Z_{F_a}$, $Z_{F_b}$, $Z_{F_c}$). Next, one embodiment determines the difference between imaginary parts of equivalent fault impedances, $X_F^{var}$ for a set of points with a different distance d to the location of the fault according to $$X_F^{var} = |\text{imag}(Z_{F_a}) - \text{imag}(Z_{F_b})| + |\text{imag}(Z_{F_b}) - \text{imag}(Z_{F_c})| + |\text{imag}(Z_{F_c}) - \text{imag}(Z_{F_a})|.$$

For example, one embodiment plots $X_F^{var}$ verse d, for the entire length of the line segment, l and determines the minimal difference between imaginary parts, $\min(X_F^{var})$ for the particular line segment. If $\min(X_F^{var}) < \delta$ and minimum value does not correspond to the end of the line segment, then the distance to fault is the corresponding d value. Else, the fault is in one of the next line segments. The fault voltage and current are determined at the next bus l+1 using Equation (28), and Equation (29). Steps of the method are repeated, until a point with a difference between imaginary parts of equivalent fault impedances at three phases below a threshold is found.

Fault Location with Load Variation

In a distribution system the exact load at each load bus is hardly ever known. The daily variations in load can be up to certain percentage of its nominal value. Accordingly, some embodiment determine the fault currents and the load currents for subsequent line segments in the lateral until the location of the fault is found, and otherwise determine the fault currents and the load currents for the line segments of the lateral with different loads until the location of the fault is found.

For example, a load variation index is estimated using the pre-fault voltage and current measured at the substation under nominal load condition. This is referred as base impedance $Z_{base}^l$. Now new equivalent impedance is determined under the current loading condition $Z_{current}^l$. A load variation index $\Delta_{load}$ is then determined as $$\Delta_{load} = \frac{z_{current}^l - z_{base}^l}{z_{base}^l}. \quad (30)$$

The load matrix is updated by multiplying with $\Delta_{load}$. A fault location algorithm with load variation adjustments is used. The load variation parameter obtained using Equation (30) is updated in a small step and fault location algorithm is executed for each updated load variation parameter. The method is repeated till an accurate fault location estimate is obtained.

Figure 12:
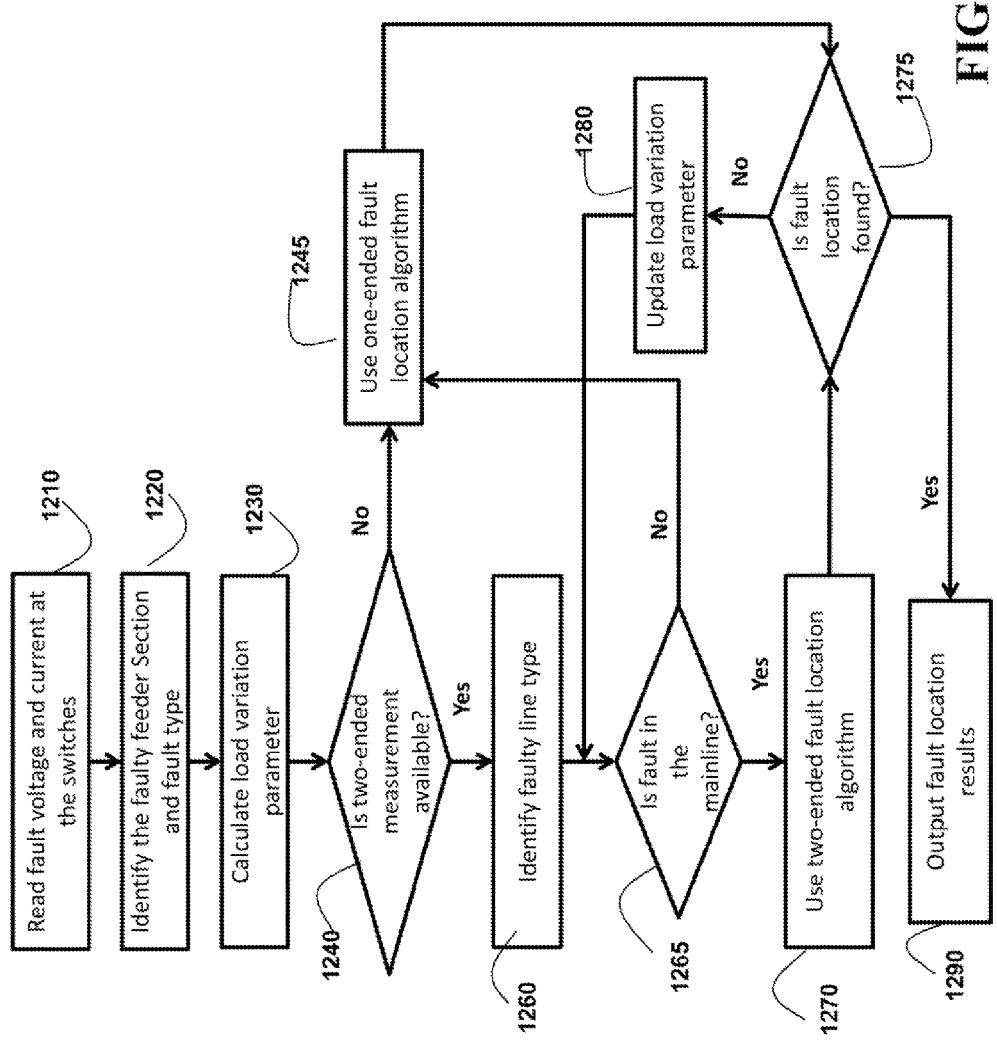
FIG. 12 is a block diagram of a method for fault location analysis of ungrounded systems with load variation according to some embodiments of invention.

FIG. 12 shows a flowchart of steps of a method for locating the fault using load variations. The method includes the following steps. The method reads 1210 voltage and current measurements at the switches during the fault and identifies 1220 the faulted feeder section and fault type. The method determines 1230 the load variation parameter using pre-fault measurements at the substation, and checks 1240 if there is two-ended measurement available for the faulted feeder section. If the measurements are available, the execution of the method goes to the step 1260; otherwise, goes to the step 1245. In step 1245, the method use one-ended fault location algorithm to determine the fault location.

The method identifies 1260 the faulted line type and checks 1265 if the fault at the mainline. If yes, the method goes to the step 1270; otherwise, goes to the step 1245. In step 1270, the method uses two-ended fault location method to determine the fault location. Next, the method checks 1275 if a fault location is found. If yes, the execution of the method goes to the step 1290; otherwise, goes to the step 1280. In step 1280, the method updates load variation parameter and the execution is proceed to step 1265. At the step 1290, the method outputs the fault location results.

The above-described embodiments of the present invention can be implemented in any of numerous ways. For example, the embodiments may be implemented using hardware, software or a combination thereof. When implemented in software, the software code can be executed on any suitable processor or collection of processors, whether provided in a single computer or distributed among multiple computers. Such processors may be implemented as integrated circuits, with one or more processors in an integrated circuit component. Though, a processor may be implemented using circuitry in any suitable format. The processor can be connected to memory, transceiver, and input/output interfaces as known in the art.

Also, the various methods or processes outlined herein may be coded as software that is executable on one or more processors that employ any one of a variety of operating systems or platforms. Alternatively or additionally, the invention may be embodied as a computer readable medium other than a computer-readable storage medium, such as signals.

The terms "program" or "software" are used herein in a generic sense to refer to any type of computer code or set of computer-executable instructions that can be employed to program a computer or other processor to implement various aspects of the present invention as discussed above.

Use of ordinal terms such as "first," "second," in the claims to modify a claim element does not by itself connote any priority, precedence, or order of one claim element over another or the temporal order in which acts of a method are performed, but are used merely as labels to distinguish one claim element having a certain name from another element having a same name (but for use of the ordinal term) to distinguish the claim elements.

Although the invention has been described with reference to certain preferred embodiments, it is to be understood that various other adaptations and modifications can be made within the spirit and scope of the invention. Therefore, it is the object of the append claims to cover all such variations and modifications as come within the true spirit and scope of the invention.

What is claimed is:

1. A method for determining a location of a fault in an ungrounded power distribution system, wherein the power distribution system includes a set of feeders connected to a substation, wherein each feeder includes a set of feeder sections, wherein each feeder section starts with an upstream switch and includes a set of loads connected by line segments and each line segment includes an upstream bus and a downstream bus, wherein the fault is a multi-phase fault including one of a phase-to-phase fault, a double-phase-to-ground fault and a three-phase fault, comprising:

determining, for a feeder, a furthest feeder section with a current at an upstream switch above a threshold as a faulty feeder section;

determining a faulty line as a lateral starting from a first bus of the faulty feeder section if the faulty feeder section lacks a downstream switch, as a lateral starting from a faulty bus on a mainline of the faulty feeder section between the upstream and the downstream switches of the faulty feeder section if a voltage of the faulty bus determined based on measurements of the upstream switch approximately equals a voltage of the faulty bus determined based on measurements of the downstream switch, or as a the mainline;

determining the location of the fault at the first bus or at the faulty bus if the lateral has only one bus;

determining, if the faulty line is the lateral and the fault is the phase-to-phase fault or the double-phase-to-ground fault, the location of the fault at a first point on an un-faulty phase of the lateral where a fault current equals a load current;

determining, if the faulty line is the lateral and the fault is the three-phase fault, the location of the fault at a point with a difference between imaginary parts of equivalent fault impedances at three phases below a threshold; and determining, if the faulty line is the mainline, a faulty segment of the faulty line between an upstream bus and a downstream bus having voltages with substantially opposite phase angles, and determining the location of the fault at a point partitioning the faulty segment on two sub-segments with a ratio of lengths determined based on the voltages at the upstream and the downstream buses, wherein steps of the method are implemented using a processor.

2. The method of claim 1, further comprising determining a first set of voltages at each bus on the mainline based on measurements of the upstream switch using a three-phase circuit analysis; and determining a second set of voltages at each bus on the mainline based on measurements of the downstream switch using the three-phase circuit analysis, comparing the voltages in the first set with the voltages in the second set to check an equality of corresponding voltages in the first and the second sets.

3. The method of claim 2, wherein the faulty line is the mainline, further comprising:

determining the faulty segment having a difference in angle differences of corresponding voltages in the first and the second set determined at the upstream and downstream buses close to 180 degree; and determining the location of the fault within the faulty segment using voltages from the first and the second set determines for the upstream and the downstream buses of the faulty segment.

4. The method of claim 3, wherein the determining the faulty line segment comprises:

determining the faulty line segment between the upstream bus n and the downstream bus n+1 using $$\angle(V_{f,A}^{n+1}-V_{f,B}^{n+1})-\angle(V_{f,A}^{n}-V_{f,B}^{n})=\pi;$$

wherein $V_{f,A}^{n}$ is the voltage of the bus n selected from the first set, $V_{f,B}^{n}$ is the voltage of the bus n selected from the second set, $V_{f,A}^{n+1}$ is the voltage of the upstream bus n+1 selected from the first set, $V_{f,B}^{n+1}$ is the voltage of the downstream bus n+1 selected from the second set, $\angle$ an angle, and $\pi$ is the degree of the angle difference in radians.

5. The method of claim 3, wherein the determining the location comprises:

determining the location of the fault within the faulty line segment according to $$\frac{V_{f,A}^{n+1}-V_{f,B}^{n+1}}{V_{f,A}^{n}-V_{f,B}^{n}}=-\frac{(l-d)}{d},$$

wherein $V_{f,A}^{n}$ is the voltage of the bus n selected from the first set, $V_{f,B}^{n}$ is the voltage of the bus n selected from the second set, $V_{f,A}^{n+1}$ is the voltage of the upstream bus n+1 selected from the first set, $V_{f,B}^{n+1}$ is the voltage of the downstream bus n+1 selected from the second set, d is a distance from a beginning of the faulty line of a length l to the location of the fault.

6. The method of claim 2, wherein the faulty line is the lateral and the fault is the phase-to-phase fault or the double-phase-to-ground fault, further comprising:

determining, for a line segment of the lateral, fault voltages, fault currents and impedances at a set of points along the line segment representing various distances to the fault from the upstream bus of the line segment;

determining equivalent line and load impedance at a downstream bus of the line segment;

determining load currents at the set of points for each phase of the line segment; and comparing the fault currents and the load currents at corresponding points to determine the location of the fault.

7. The method of claim 6, further comprising:

determining the fault currents and the load currents for subsequent line segments in the lateral until the location of the fault is found, and otherwise determining the fault currents and the load currents for the line segments of the lateral with different loads until the location of the fault is found.

8. The method of claim 2, wherein the faulty line is the lateral and the fault is the three-phase fault, further comprising:

determining the equivalent fault impedance using fault currents and load currents obtained by varying the distance to the location of the fault; and determining the difference between imaginary parts of equivalent fault impedances for a set of points with a different distance d to the location of the fault according to $$|\text{imag}(Z_{F_a})-\text{imag}(Z_{F_b})|+|\text{imag}(Z_{F_b})-\text{imag}(Z_{F_c})|+|\text{imag}(Z_{F_c})-\text{imag}(Z_{F_a})|,$$

wherein $Z_{F_a}$, $Z_{F_b}$ and $Z_{F_c}$ are the equivalent fault impedances for phase a, phase b and phase c respectively.

9. A method for determining a location of a fault in an ungrounded power distribution system, wherein the power distribution system includes a set of feeders connected to a substation, wherein each feeder includes a set of feeder sections, wherein each feeder section starts with an upstream switch and includes a set of loads connected by line segments and each line segment includes an upstream bus and a downstream bus, wherein the fault is a multi-phase fault including one of a phase-to-phase fault, a double-phase-to-ground fault and a three-phase fault, comprising:

determining, for a feeder, a furthest feeder section with a current at an to upstream switch above a threshold as a faulty feeder section;

determining a faulty line as a lateral starting from a first bus of the faulty feeder section if the faulty feeder section lacks a downstream switch, as a lateral starting from a faulty bus on a mainline of the faulty feeder section between the upstream and the downstream switches of the faulty feeder section if a voltage on the bus determined based on measurements of the upstream switch approximately equals a voltage of the bus determined based on measurements of the downstream switch, or as the mainline;

determining the location of the fault on a faulty line segment using a two-ended fault location method, if the faulty line is the mainline; and determining the location of the fault on the faulty line segment using a one-ended method if the faulty line is the lateral.

10. A system for determining a location of a fault in an ungrounded power distribution system, wherein the power distribution system includes a set of feeders connected to a substation, wherein each feeder includes a set of feeder sections, wherein each feeder section starts with an upstream switch and includes a set of loads connected by line segments and each line segment includes an upstream bus and a downstream bus, wherein the fault is a multi-phase fault including one of a phase-to-phase fault, a double-phase-to-ground fault and a three-phase fault, comprising a processor configure for:

determining, for a feeder, a furthest feeder section with a current at an upstream switch above a threshold as a faulty feeder section;

determining a faulty line as a lateral starting from a first bus of the faulty feeder section if the faulty feeder section lacks a downstream switch, as a lateral starting from a faulty bus on a mainline of the faulty feeder section between the upstream and the downstream switches of the faulty feeder section if a voltage on the bus determined based on measurements of the upstream switch approximately equals a voltage of the bus determined based on measurements of the downstream switch, or as the mainline;

determining the location of the fault at the first bus or at the faulty bus if the lateral has only one bus;

determining, if the faulty line is the lateral and the fault is the phase-to-phase fault or the double-phase-to-ground fault, the location of the fault at a first point on an un-faulty phase of the lateral where a fault current equals a load current;

determining, if the faulty line is the lateral and the fault is the three-phase fault, the location of the fault at a point with a difference between imaginary parts of equivalent fault impedances at three phases below a threshold; and determining, if the faulty line is the mainline, a faulty segment of the faulty line between an upstream bus and a downstream bus having voltages with substantially opposite phase angles, and determining the location of the fault at a point partitioning the faulty segment on two sub-segments with a ratio of lengths determined based on the voltages at the upstream and the downstream buses.

* * * * *